US008860168B2

(12) United States Patent
Chang et al.

(10) Patent No.: US 8,860,168 B2
(45) Date of Patent: Oct. 14, 2014

(54) SCHOTTKY ISOLATED NMOS FOR LATCH-UP PREVENTION

(75) Inventors: Yi-Feng Chang, Xinbei (TW); Jam-Wem Lee, Zhubei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 13/603,329

(22) Filed: Sep. 4, 2012

(65) Prior Publication Data
US 2014/0061848 A1    Mar. 6, 2014

(51) Int. Cl.
H01L 29/66    (2006.01)
H01L 29/04    (2006.01)
H01L 29/792   (2006.01)
H01L 29/47    (2006.01)

(52) U.S. Cl.
USPC .............. 257/476; 257/64; 257/324; 257/471

(58) Field of Classification Search
CPC ........ H01L 29/06; H01L 29/66; H01L 29/782
USPC ............................ 257/476, 64, 324, 471, 484
See application file for complete search history.

(56) References Cited

U.S. PATENT DOCUMENTS

| 2004/0012066 | A1* | 1/2004 | Dietl et al. ..................... 257/471 |
| 2005/0077590 | A1* | 4/2005 | Swanson et al. ............... 257/484 |
| 2006/0125040 | A1* | 6/2006 | Levin et al. .................... 257/471 |
| 2006/0244050 | A1* | 11/2006 | Sudou ............................ 257/324 |
| 2010/0164050 | A1* | 7/2010 | Ho et al. ......................... 257/484 |
| 2010/0200947 | A1* | 8/2010 | Hung et al. ..................... 257/510 |
| 2010/0327288 | A1* | 12/2010 | Chao et al. ...................... 257/64 |

* cited by examiner

Primary Examiner — Long K Tran
Assistant Examiner — Dzung Tran
(74) Attorney, Agent, or Firm — Slater & Matsil, L.L.P.

(57) ABSTRACT

An integrated circuit structure includes a substrate, a semiconductor device supported by the substrate, and a guard ring structure disposed around the semiconductor device, the guard ring structure forming a Schottky junction. In an embodiment, the Schottky junction is formed from a p-type metal contact and an n-type guard ring. In an embodiment, the guard ring structure is electrically coupled to a positive or negative supply voltage.

19 Claims, 4 Drawing Sheets

SCHOTTKY ISOLATED NMOS FOR LATCH-UP PREVENTION

BACKGROUND

Latch-up is a condition in which a circuit draws uncontrolled amounts of current, and certain voltages are forced, or "latched-up," to some undesirable and uncontrollable level that violates the operating conditions of the circuit. Latch-up conditions are most often caused by crosstalk between devices in an integrated circuit.

In an integrated circuit (IC) having multiple devices monolithically built on the same substrate, unintended parasitic devices such as transistors, diodes, or resistors may cause undesirable crosstalk between other devices. Undesirable crosstalk between devices may exist in bipolar integrated circuits, as well as field effect transistors such as a metal-oxide-semiconductor field effect transistor (MOSFET).

By way of example, in a complimentary metal-oxide-semiconductor (CMOS) based integrated circuit, an n-well, a p-substrate, and another n-doped region may form a parasitic NPN transistor. The parasitic NPN transistor may be turned on when one of the PN junctions in the transistor is forward-biased. This may undesirably cause latch-up of another device on the integrated circuit and, in some cases, even permanently damage the integrated circuit.

One conventional method of preventing latch-up involves surrounding the NMOS and PMOS transistors (both input/output (I/O) and logic) with a guard ring. Such guard rings may be able to collect parasitic NPN and PNP currents locally and prevent unintentional turn-on of adjacent devices.

BRIEF DESCRIPTION OF THE DRAWINGS

For a more complete understanding of the present disclosure, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION OF ILLUSTRATIVE EMBODIMENTS

The making and using of the presently preferred embodiments are discussed in detail below. It should be appreciated, however, that the present disclosure provides many applicable inventive concepts that can be embodied in a wide variety of specific contexts. The specific embodiments discussed are merely illustrative and do not limit the scope of the disclosure.

The present disclosure will be described with respect to preferred embodiments in a specific context, namely an integrated circuit device. The concepts in the disclosure may also apply, however, to other semiconductor structures or circuits.

Figure 1:
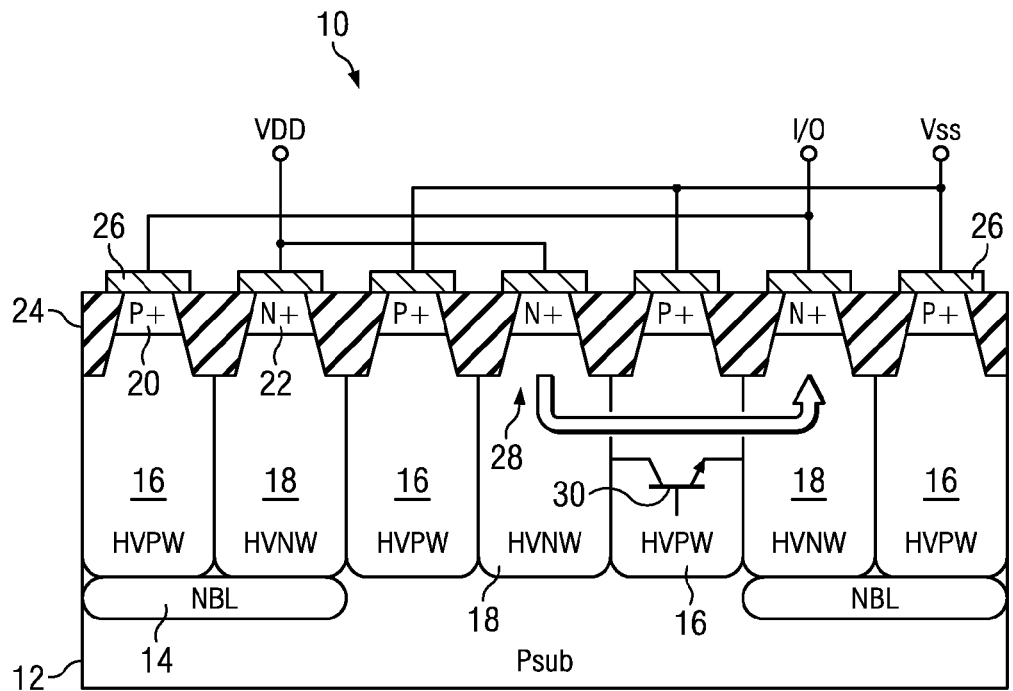
FIG. 1 is a cross section of a conventional guard ring structure tied to a positive supply voltage.

Referring to FIG. 1, a conventional guard ring structure 10 is illustrated for the purpose of reference. As shown, the conventional guard ring structure 10 includes a p-type substrate 12 that supports spaced-apart n-type buried layers 14. The substrate 12 also supports a plurality of high-voltage p-type wells 16 alternating with high-voltage n-type wells 18. Highly-doped p-type regions 20 are disposed above the high-voltage p-type wells 16 while highly-doped n-type regions 22 are disposed above the high-voltage n-type wells 18. The highly-doped p-type regions 20 and the highly-doped n-type regions 22 are isolated from each other by an insulator 24 (e.g., an oxide, shallow trench isolation (STI), etc.).

Each of the highly-doped p-type regions 20 and the highly-doped n-type regions 22 support a p-type metal contact 26. As shown in FIG. 1, some of the metal contacts 26 are electrically coupled to a positive supply voltage, $V_{dd}$, a negative supply voltage, $V_{ss}$, or an input/output node, I/O, which may be employed to inject either positive or negative current. In addition, some of the metal contacts 26 and the highly-doped n-type regions 22 form a guard ring 28 intended to prevent latch-up of the semiconductor device 30 that, for purposes of illustration only, is depicted as a transistor. Unfortunately, when the guard ring 28 is electrically coupled to the positive supply voltage, $V_{dd}$, a parasitic NPN safe operating area (SOA) issue arises, which is illustrated by the arrow above the semiconductor device.

Figure 2:
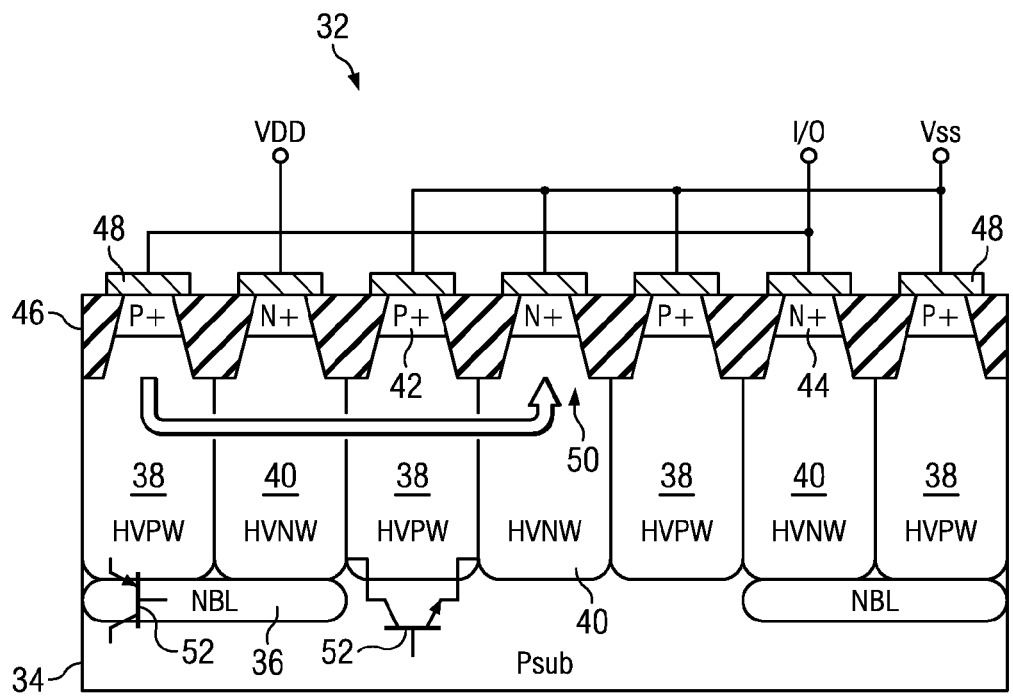
FIG. 2 is a cross section of another conventional guard ring structure tied to a negative supply voltage.

Referring now to FIG. 2, another conventional guard ring structure 32 is illustrated for the purpose of reference. As shown, the conventional guard ring structure 32 includes a p-type substrate 34 that supports spaced-apart n-type buried layers 36. The substrate 34 also supports a plurality of high-voltage p-type wells 38 alternating with high-voltage n-type wells 40. Highly-doped p-type regions 42 are disposed above the high-voltage p-type wells 38 while highly-doped n-type regions 44 are disposed above the high-voltage n-type wells 40. Highly-doped p-type regions 42 and the highly-doped n-type regions 44 are isolated from each other by an insulator 46.

Each of the highly-doped p-type regions 42 and the highly-doped n-type regions 44 support a p-type metal contact 48. As shown in FIG. 2, some of the metal contacts 48 are electrically coupled to a positive supply voltage, $V_{dd}$, a negative supply voltage, $V_{ss}$, or an input/output node, I/O. In addition, some of the metal contacts 48 and the highly-doped n-type regions 44 form a guard ring 50 intended to prevent latch-up of the semiconductor devices 52 that, for purposes of illustration only, are depicted as transistors. Unfortunately, when the guard ring 50 is electrically coupled to a negative supply voltage, $V_{ss}$, (e.g., a ground) an additional PNPN path is formed, which is illustrated by the arrow above the semiconductor devices.

Figure 3:
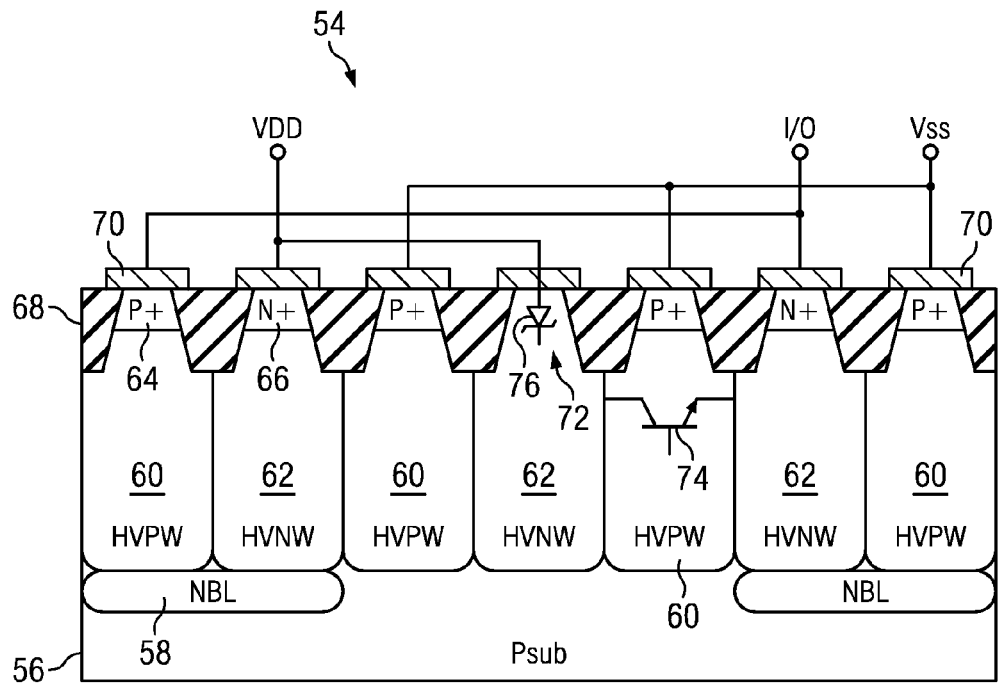
FIG. 3 is an embodiment guard ring structure tied to a positive supply voltage and including a Schottky junction.

Referring now to FIG. 3, an embodiment guard ring structure 54 is illustrated. As shown, the embodiment guard ring structure 54 includes a p-type substrate 56 that supports spaced-apart n-type buried layers 58. The substrate 56 also supports a plurality of high-voltage p-type wells 60 alternating with high-voltage n-type wells 62. Highly-doped p-type regions 64 are disposed above the high-voltage p-type wells 60 while highly-doped n-type regions 66 are disposed above some of the high-voltage n-type wells 62. The highly-doped p-type regions 64 and the highly-doped n-type regions 66 are isolated from each other by an insulator 68.

In the embodiment guard ring structure 54 of FIG. 3, each of the highly-doped p-type regions 64, some of the highly-doped n-type regions 66, and a central one of the high-voltage n-wells 62 support a p-type metal contact 70. In an embodiment, the metal contacts 70 are formed from a cobalt silicide having a work function at about a valence band (i.e., about 4.7 volts). As shown in FIG. 3, in an embodiment the central one of the metal contacts 70 is disposed above a central one of the high-voltage n-wells 62 to form a guard ring 72. The guard ring 72 generally surrounds and/or isolates the semiconductor device 74.

Because the guard ring 72 includes one of the metal contacts 70 and one of the high-voltage n-wells 62, a Schottky junction 76 (e.g., Schottky diode) is generated. The Schottky junction 76 is configured to prevent undesirable latch-up when the semiconductor device 74 is operated. As shown in FIG. 3, in an embodiment the guard ring 72 is electrically coupled to the positive supply voltage, $V_{dd}$. Therefore, the Schottky junction 72 is configured to switch into forward mode to prevent negative trigger latch-up. In addition, the Schottky junction 72 is configured to reduce a current ratio to suppress parasitic NPN safe operating area (SOA) failure for a powered guard ring case (as illustrated in FIG. 1).

Figure 4:
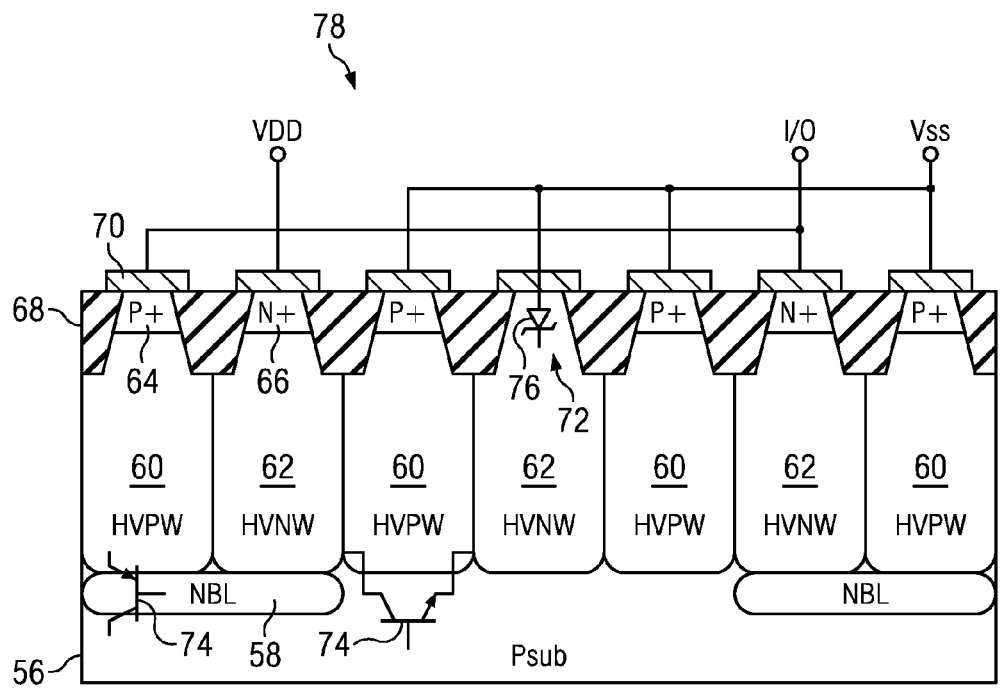
FIG. 4 is an embodiment guard ring structure tied to a negative supply voltage and including a Schottky junction.

Referring now to FIG. 4, an embodiment guard ring structure 78 is illustrated. Unlike the guard ring structure 54 of FIG. 3, the guard ring structure 78 of FIG. 4 is electrically coupled to the negative supply voltage, $V_{ss}$. Therefore, the Schottky junction 76 is configured to switch into reverse mode to prevent positive trigger latch-up. In addition, the Schottky junction 76 is configured to terminate the additional PNPN path for a grounded guard ring case (as illustrated in FIG. 2).

Figure 5:
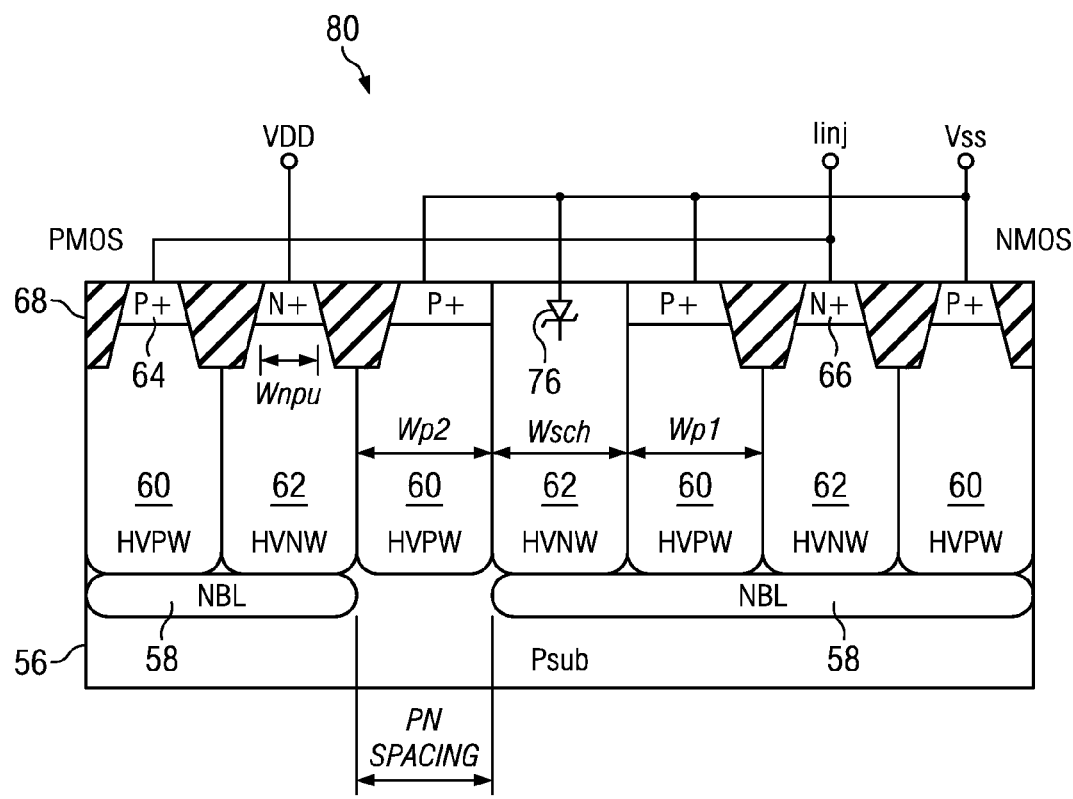
FIG. 5 illustrates various dimensions of an embodiment guard ring structure similar to the guard ring structure of FIG. 4.

Referring now to FIG. 5, an embodiment guard ring structure 80 is illustrated. In the guard ring structure 80 of FIG. 5, the Schottky junction 76 is formed by the highly-doped regions 64 flanking the central high-voltage n-well 62. In other words, the p-type metal contacts 70 of FIGS. 3-4 are no longer employed. Moreover, the n-type buried layer 58 below the negative supply voltage, $V_{ss}$, ties together several of the n-type wells 62 and p-type wells 60, including the n-type well 62 vertically beneath the Schottky junction 76.

Still referring to FIG. 5, various dimensions for the embodiment guard ring structure 80 are illustrated. In an embodiment, a width, Wnpu, of the highly-doped region (N+) 66 tied to the positive voltage supply, $V_{dd}$, is about 7 μm and a width, Wp2, of the adjacent high-voltage well 60, which is a p-type, is about 4.9 μm. In addition, a width, Wsch, of the high-voltage well 62, which is an n-type and assists in forming the Schottky junction 76, is about 1.8 μm and a width, Wp1, of the adjacent high-voltage well 60, which is a p-type, is about 2.4 μm. Also, a spacing, PN Spacing, between n-type buried layers 58 (which is equivalent to the width, Wp2, of the high-voltage well 60) is about is about 4.9 μm. Because a PN Spacing of the conventional guard ring structure is generally about 25 μm, the spacing, PN Spacing, of about 4.9 μm in the embodiment guard ring structure 80 provides about an 80% reduction in spacing.

The various dimensions described with regard to FIG. 5 are not meant to be limiting and are representative only. Indeed, in other embodiments other widths or spacing, either larger or smaller than those described with regard to FIG. 5, are contemplated for the guard ring structures disclosed herein.

Figure 6:
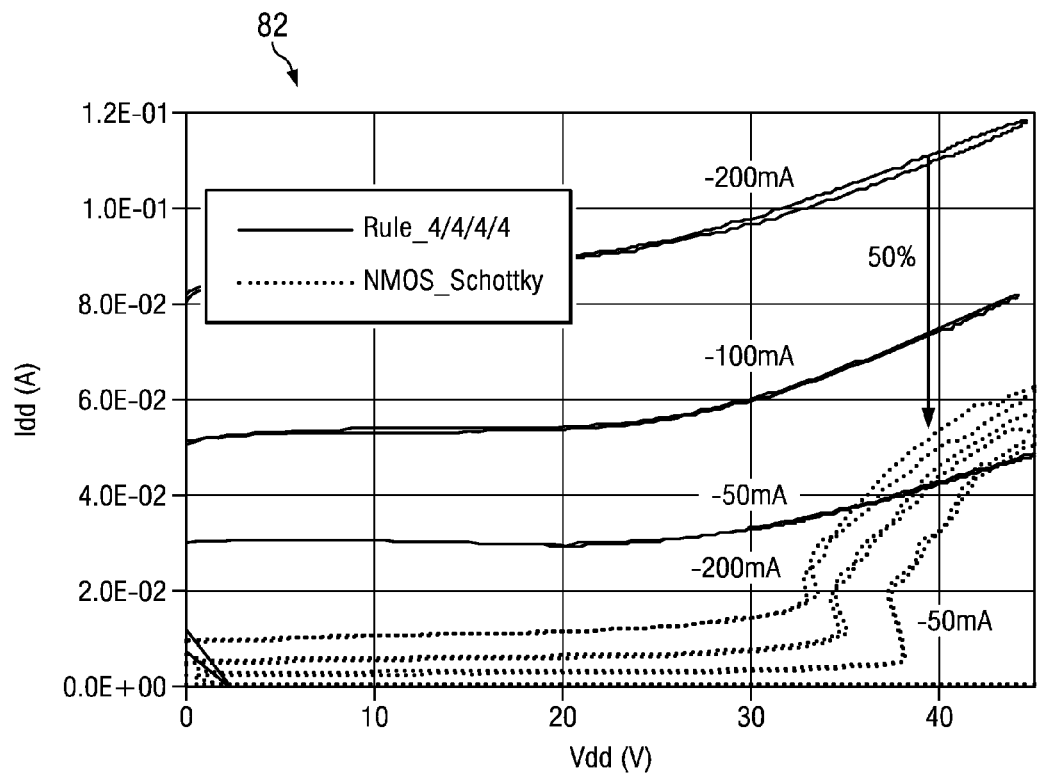
FIG. 6 is a graphical representation of a reduction of power consumption for a Schottky-isolated n-type metal-oxide-semiconductor (NMOS) safe operating area (SOA) during negative current injection.
Figure 7:
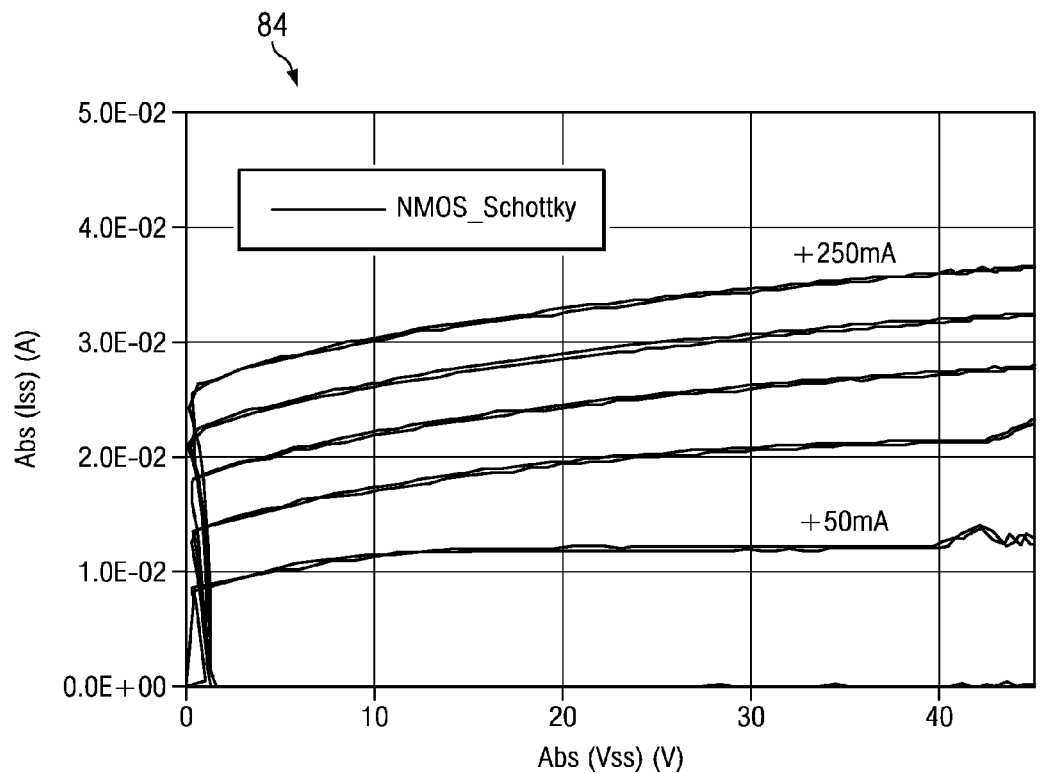
FIG. 7 is a graphical representation of the Schottky-isolated NMOS SOA during positive current injection.

FIG. 6 a graphical representation 82 of a reduction of power consumption for a Schottky-isolated n-type metal-oxide-semiconductor (NMOS) safe operating area (SOA) during negative current injection. As shown, the power consumption is reduced by about 50% for the NMOS Schottky structure using the 80% PN Spacing reduction in a CO25 40V BCD. FIG. 7 is a graphical representation 84 of the Schottky-isolated NMOS SOA during positive current injection.

It should be recognized from the foregoing that use of the Schottky junction 76 in the guard ring structures 54, 78, 80 provides advantages such as, for example, prevention of latch up failures, better latch-up level for rule sizing down without the need for a process change, lower power consumption during normal operation, and so on.

An integrated circuit structure including a substrate, a semiconductor device supported by the substrate, and a guard ring disposed around the semiconductor device, the guard ring including a Schottky junction.

An integrated circuit structure including a substrate, a semiconductor device formed within the substrate, and a guard ring isolating the semiconductor device, the guard ring including a p-type metal disposed over an n-type doped region to generate a Schottky junction, the Schottky junction configured to prevent latch-up when the semiconductor device is operated.

A method of forming an integrated circuit structure including forming a semiconductor device supported by a substrate and disposing a guard ring around the semiconductor device, the guard ring including a Schottky junction.

While the disclosure provides illustrative embodiments, this description is not intended to be construed in a limiting sense. Various modifications and combinations of the illustrative embodiments, as well as other embodiments, will be apparent to persons skilled in the art upon reference to the description. It is therefore intended that the appended claims encompass any such modifications or embodiments.

What is claimed is:

1. An integrated circuit structure, comprising:
   a substrate;
   a semiconductor device supported by the substrate; and
   a guard ring comprising an n-type doped well disposed in the substrate, the n-type doped well being around the semiconductor device, a metal contact being disposed adjoining the n-type doped well and on the substrate, a junction between the metal contact and the n-type doped well forming a Schottky junction, the metal contact being electrically coupled to a power supply node.

2. The integrated circuit structure of claim 1, wherein the metal contact is formed from cobalt silicide.

3. The integrated circuit structure of claim 1, wherein a work function of the metal contact is at about a valence band.

4. The integrated circuit structure of claim 1, wherein the n-type doped well has a width of less than about 2 μm.

5. The integrated circuit structure of claim 1, wherein the power supply node is a positive supply voltage node.

6. The integrated circuit structure of claim 1, wherein the power supply node is a negative supply voltage node.

7. The integrated circuit structure of claim 1, wherein the Schottky junction is configured to prevent latch-up when the semiconductor device is operated.

8. The integrated circuit structure of claim 1, wherein the Schottky junction is configured to switch into forward mode to prevent negative trigger latch-up.

9. The integrated circuit structure of claim 1, wherein the Schottky junction is configured to switch into reverse mode to prevent positive trigger latch-up.

10. The integrated circuit structure of claim 1, wherein the substrate supports first and second buried layers, the first buried layer horizontally spaced-apart from the second buried layer by less than about 5 μm.

11. An integrated circuit structure, comprising:
a substrate;
a semiconductor device formed within the substrate; and
a guard ring isolating the semiconductor device, the guard ring including a metal disposed over and adjoining an n-type doped region to form a Schottky junction, the n-type doped region surrounding the semiconductor device, the Schottky junction positioned to prevent latch-up when the semiconductor device is operated.

12. The integrated circuit structure of claim 11, wherein the metal is cobalt silicide.

13. The integrated circuit structure of claim 11, wherein the Schottky junction is configured to switch into forward mode to prevent negative trigger latch-up.

14. The integrated circuit structure of claim 11, wherein the Schottky junction is configured to switch into reverse mode to prevent positive trigger latch-up.

15. The integrated circuit structure of claim 11, wherein the guard ring is electrically coupled to a positive supply voltage through the metal.

16. The integrated circuit structure of claim 11, wherein the guard ring is electrically coupled to a negative supply voltage through the metal.

17. A method of forming an integrated circuit, comprising:
forming a semiconductor device supported by a substrate; and
disposing a guard ring around the semiconductor device, the guard ring including a Schottky junction formed from a metal contact over and adjoining an n-type doped region in the substrate, the n-type doped region surrounding the semiconductor device.

18. The method of claim 17, further comprising electrically coupling metal contact to a power supply node.

19. An integrated circuit structure, comprising:
a substrate;
a semiconductor device supported by the substrate;
a guard ring comprising a first doped well disposed in the substrate, the first doped well being an n-type doped well, the first doped well being around the semiconductor device, a metal contact being disposed adjoining the first doped well and on the substrate, a junction between the metal contact and the first doped well forming a Schottky junction, the metal contact being electrically coupled to a power supply node; and
a second doped well disposed in the substrate, the second doped well not being surrounded by the guard ring, the second doped well being distinct from the first doped well; and
a third doped well disposed in the substrate and in the second doped well, the third doped well being a same type doped well as the second doped well, the third doped well being doped more than the second doped well, the metal contact being electrically coupled to the third doped well.

* * * * *